United States Patent
Kang et al.

(10) Patent No.: US 9,082,762 B2
(45) Date of Patent: Jul. 14, 2015

(54) ELECTROMIGRATION-RESISTANT UNDER-BUMP METALLIZATION OF NICKEL-IRON ALLOYS FOR SN-RICH SOLDER BUMPS IN PB-FREE FLIP-CLIP

(75) Inventors: Sung K. Kang, Armonk, NY (US); Paul A. Lauro, Armonk, NY (US); Minhua Lu, Armonk, NY (US); Da-Yuan Shih, Armonk, NY (US)

(73) Assignee: International Business Machines Corporation, Armonk ( * ) Notice: Subject to any disclaimer, the term of this patent is extended or adjusted under 35 U.S.C. 154(b) by 699 days.

(21) Appl. No.: 12/647,999

(22) Filed: Dec. 28, 2009

(65) Prior Publication Data

US 2011/0156256 A1 Jun. 30, 2011

(51) Int. Cl.
*H01L 23/48* (2006.01)
*H01L 21/44* (2006.01)
(Continued)

(52) U.S. Cl.
CPC .......... *H01L 23/49811* (2013.01); *H01L 24/05* (2013.01); *H01L 24/81* (2013.01); *H01L 24/03* (2013.01); *H01L 24/13* (2013.01); *H01L 2224/05147* (2013.01); *H01L 2224/05562* (2013.01); *H01L 2224/05564* (2013.01); *H01L 2224/05655* (2013.01); *H01L 2224/11849* (2013.01); *H01L 2224/13111* (2013.01); *H01L 2224/16503* (2013.01); *H01L 2924/0002* (2013.01); *H01L 2924/00013* (2013.01); *H01L 2924/0103* (2013.01); *H01L 2924/014* (2013.01); *H01L 2924/01005* (2013.01); *H01L 2924/01006* (2013.01); *H01L 2924/0109* (2013.01); *H01L 2924/01013* (2013.01); *H01L 2924/01021* (2013.01); *H01L 2924/01023* (2013.01); *H01L 2924/01024* (2013.01); *H01L 2924/01029* (2013.01); *H01L 2924/01033* (2013.01); *H01L 2924/01041* (2013.01); *H01L 2924/01047* (2013.01); *H01L 2924/01049* (2013.01);
(Continued)

(58) Field of Classification Search
CPC ......... H01L 24/05; H01L 24/81; H01L 24/13; H01L 2924/01026; H01L 2924/014; H01L 2224/0517; H01L 2224/451554
See application file for complete search history.

(56) References Cited

U.S. PATENT DOCUMENTS

5,937,320 A * 8/1999 Andricacos et al. .......... 438/614
6,043,557 A 3/2000 Phelps, Jr. et al.
(Continued)

*Primary Examiner* — Alonzo Chambliss
(74) *Attorney, Agent, or Firm* — Robert J. Eichelburg; The Law Offices of Robert J. Eichelburg (57) ABSTRACT

A process comprises manufacturing an electromigration-resistant under-bump metallization (UBM) flip chip structure comprising a Cu layer by applying to the Cu layer a metallic reaction barrier layer comprising NiFe. The solder employed in the flip chip structure comprise substantially lead-free tin. A structure comprises a product produced by this process. In another embodiment a process comprises manufacturing an electromigration-resistant UBM Sn-rich Pb-free solder bump flip chip structure wherein the electromigration-resistant UBM structure comprises a four-layer structure, or a three-layer structure, wherein the four layer structure is formed by providing 1) an adhesion layer, 2) a Cu seed layer for plating, 3) a reaction barrier layer, and 4) a wettable layer for joining to the solder, and the three-layer structure is formed by providing 1) an adhesion layer, 2) a reaction barrier layer, and 3) a wettable layer. In a further embodiment, the reaction barrier layer comprises metals selected from Ni, Fe, Pd, Pt, Co, Cu and their alloys, and combinations thereof. A structure comprises a product produced by the immediately foregoing process.

31 Claims, 7 Drawing Sheets

(51) Int. Cl.
*H01L 23/498* (2006.01)
*H01L 23/00* (2006.01)

(52) U.S. Cl.
CPC ............ *H01L2924/01051* (2013.01); *H01L 2924/01063* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01327* (2013.01); *H01L 2924/10253* (2013.01); *H01L 2924/1461* (2013.01)

(56) References Cited

U.S. PATENT DOCUMENTS

| | | | |
|---|---|---|---|
| 6,077,765 A * | 6/2000 | Naya | 438/614 |
| 6,224,690 B1 * | 5/2001 | Andricacos et al. | 148/400 |
| 6,346,469 B1 * | 2/2002 | Greer | 438/614 |
| 6,622,907 B2 * | 9/2003 | Fanti et al. | 228/215 |
| 6,673,711 B2 * | 1/2004 | Tong et al. | 438/613 |
| 7,157,372 B1 | 1/2007 | Trezza | |
| 7,215,032 B2 | 5/2007 | Trezza | |
| 7,218,000 B2 | 5/2007 | Houle | |
| 7,223,695 B2 | 5/2007 | Zhong et al. | |
| 7,273,803 B2 * | 9/2007 | Cheng et al. | 438/612 |
| 7,417,310 B2 | 8/2008 | Szewerenko et al. | |
| 7,482,272 B2 | 1/2009 | Trezza | |
| 7,514,292 B2 | 4/2009 | Efland et al. | |
| 7,521,806 B2 | 4/2009 | Trezza | |
| 7,534,722 B2 | 5/2009 | Trezza | |
| 7,538,033 B2 | 5/2009 | Trezza | |
| 7,560,813 B2 | 7/2009 | Trezza | |
| 7,659,202 B2 | 2/2010 | Trezza | |
| 2003/0155408 A1 * | 8/2003 | Fanti et al. | 228/215 |
| 2004/0104484 A1 * | 6/2004 | Chen et al. | 257/772 |
| 2007/0045848 A1 * | 3/2007 | Tai et al. | 257/738 |
| 2007/0232051 A1 * | 10/2007 | Wang et al. | 438/612 |
| 2008/0050905 A1 * | 2/2008 | Uchida et al. | 438/614 |
| 2008/0067656 A1 * | 3/2008 | Leung et al. | 257/686 |
| 2009/0032942 A1 * | 2/2009 | Choi | 257/737 |
| 2009/0114345 A1 * | 5/2009 | Nakayama et al. | 156/344 |
| 2009/0174052 A1 * | 7/2009 | Sogawa et al. | 257/690 |
| 2010/0062597 A1 * | 3/2010 | Belanger et al. | 438/613 |

* cited by examiner

ELECTROMIGRATION-RESISTANT UNDER-BUMP METALLIZATION OF NICKEL-IRON ALLOYS FOR SN-RICH SOLDER BUMPS IN PB-FREE FLIP-CLIP

FIELD OF THE INVENTION

The field of the invention comprises electromigration-resistant under-bump metallization (UBM) of nickel-iron alloys for Sn-rich solder bumps employed in Pb-free flip chip applications.

Flip chip or "controlled collapse chip connection," known by the industry acronym "C4" comprise the terms for describing the IBM method of connecting semiconductor and other devices such as integrated circuits ("IC" chips) and micro electromechanical systems ("MEMS"), both of which are well known in the art. C4 interconnects employ under bump metallization (UBM), sometimes referred to as ball limiting metallurgy (BLM) structures as part of these interconnects.

BACKGROUND OF THE INVENTION AND RELATED ART

To meet the requirements of the EU's RoHS (Reduction of Hazardous Materials) legislation, Pb-free solder technology is being well implemented in consumer electronics and mid-range electronic systems, however, several technical issues have been recently identified in the first level interconnect structure, such as chip-to-package interactions (CPI), e.g., ILD (Interlayer Dielectric) delamination or cracking (or "white bumps") in back end of the line structure (BEOL) of the chip during initial chip joining, and electromigration (EM) in flip-chip joints under high current density.

The white bump issue is largely due to the inherent high strength of Sn—Ag—Cu (SAC) and SnCu (SC) solders combined with the fragile dielectric materials used in the back-end-of-line (BEOL) structure of the advanced complementary metal-oxide-semiconductor (CMOS) chip design. The white bump issue has been successfully addressed by reducing Ag content in SAC solders combined with an improved design of the BEOL structure. However, in doing so, the EM resistance of flip-chip solder joints is greatly compromised in low-Ag, Sn-rich solder bumps. In our recent EM studies it has been found that the metallurgical (or microstructural) factors are crucial in determining the EM performance, for example, Sn—Ag solders provide a better EM lifetime than Sn—Cu solders. Cf. M. Lu, D-Y Shih, P. Lauro, C. Goldsmith, and D. W. Henderson, "Effect of Sn grain orientation on electromigration degradation mechanism in high Sn-based Pb-free solders," *Appl. Phys. Let.* v. 92, 211909 (2008).

A fundamental issue owing to the anisotropic properties of Sn single crystals is found to be responsible for the premature failures under high current EM tests. Lu et al., supra. The solute atoms such as Cu, Ag, or Ni are known to transport much faster along the C-axis than a- or b-axis of the body centered tetragonal Sn single crystal structure. Since a typical flip-chip solder joint consists essentially of only a few Sn crystals, the anisotropic properties of Sn single crystals critically affect EM performance and other physical/mechanical properties when Sn crystals are oriented in a less favorable direction. The high Pb, flip-chip interconnection performs much better in EM tests than Sn-rich solders, since a Pb crystal is isotropic and Pb has a much higher melting point (328° C.) than Sn (232° C.).

In order to control the microstructure of Sn-rich solders and thereby to improve EM performance and other properties, minor alloying additions to Sn-rich solders (such as Ni, Zn, Ti, Sb, Bi, and others) have been extensively investigated. Among them, Zn addition was found to be the most effective in enhancing EM performance with other beneficial effects. The microstructure study of Zn-doped solders has revealed that minor Zn addition stabilizes the microstructure of Sn-rich solders during high temperature aging as well as EM tests.

A reaction barrier layer in the UBM structure is important to the reliability of C4 solder joint. A good UBM needs to be wet well by the solder and form stable, but not too many, intermetallic compounds at the interface during solder reflow. To meet electromigration reliability requirements the UBM should contain a good reaction barrier layer. Cu is one of the common surface finishes. Cu is wet well by solder, but the interfacial reaction of Cu and Sn based Pb-free solder is aggressive. In addition Cu diffuses rapidly under an electric current. Cu rapidly converts into a Cu—Sn intermetallic composition (IMC) under thermal and EM stress, resulting in poor reliability.

Figure 2:
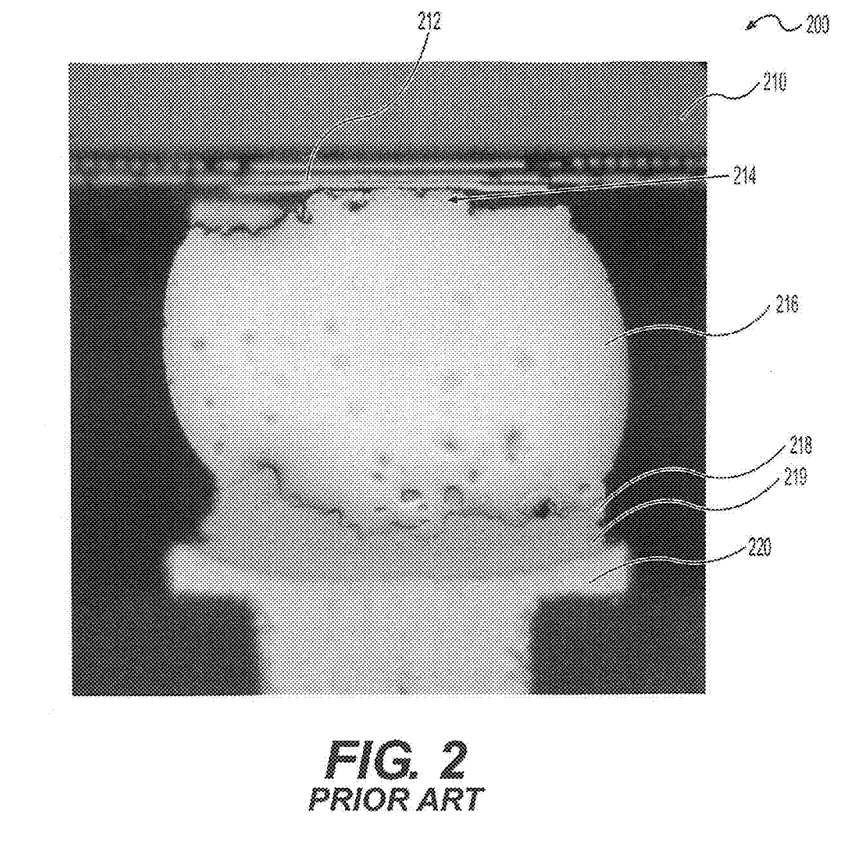
FIG. 2 comprises a photomicrograph of Ni UBM consumption after electromigration (EM) testing.
Figure 3:
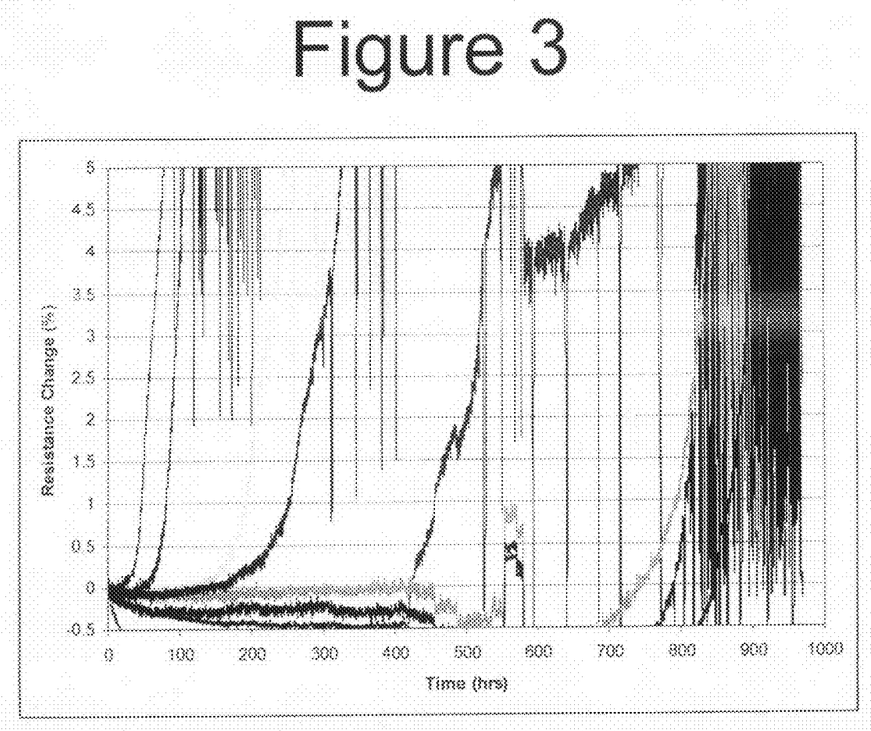
FIG. 3 comprises a plot of percentage of resistance increase ($\Delta R$) (%) of 8 samples with a Ni/Sn1.8Ag Solder/Ni structure over time after EM testing where Ni is used as a barrier layer.

Ni UBM is widely used to improve Cu UBM. Although Ni showed slower interfacial reaction than Cu, Ni UBM consumption is faster in Pb-free solder joint, especially when Ni UBM is used as a surface finish for both the chip and substrates (Cf. FIGS. 2, 3). Various Ni barrier layers over Cu UBM were extensively evaluated for this purpose (S. K. Kang, M. G. Cho, D-Y Shih, S. K. Seo, and H. M. Lee, "Controlling the Interfacial Reactions in Pb-free Interconnections by Adding Minor Alloying Elements to Sn-rich Solders," *Proc.* $58^{th}$ *ECTC*, Orlando, Fla., May, 2008, pp. 478-484, (2008)). Due to aggressive interfacial reactions of Sn-rich solders during multiple reflows and high current EM tests, however, most Ni barrier layers investigated do not provide adequate protection in terms of the interfacial reactions and EM resistance.

SUMMARY OF THE INVENTION

Accordingly, the present invention provides structures, articles of manufacture and processes that address these needs to not only provide advantages over the related art, but also to substantially obviate one or more of the foregoing and other limitations and disadvantages of the related art such as providing electromigration-resistant under-bump metallization of nickel-iron alloys for Sn-rich solder bumps employed in Pb-free flip chip applications. Not only do the written description, claims, abstract of the disclosure, and the drawings that follow set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, the invention comprises a process, composition, and an improved structure of Ni—Fe alloys for Pb-free, solder bumps to be used in high-end server applications and addresses the need to enhance electromigration performance, i.e., the elimination or reduction of electromigration. Our previous work on Ni—Fe UBM for lead-free flip-chip interconnection did not address the need to enhance electromigration performance. Cf. S. K. Kang, J. Horkans, P. Andricacos, R. Crruthers, J. Cotte, M. Datta, P. Gruber, J. Harper, K. Kwietniak, C. Sambucetti, L. Shi, G. Brouillette and D. Danovitch, "Pb-Free Solder Alloys for Flip Chip Applications," *Proc.* 49*th Elec. Comp. Tech. Conf.*, San Diego, Calif., June 1999, p. 283-88; P. Andricacos, M. Datta, H. Deligianni, J. Horkans, S. Kang, K. Kwietniak, G. Mathad, S. Purushothaman, L. Shi, H. Tong, U.S. Pat. No. 6,224,690, issued May 1, 2001 "Flip-Chip Interconnections Using Lead-Free Solders."

BRIEF DESCRIPTION OF THE DRAWINGS

The accompanying drawings also set out the invention and are incorporated in and constitute a part of this specification and are included to illustrate various embodiments of the invention and together with this written description also serve to explain the principles of the invention.

FIG. 5, (a) through (f) comprises side elevations in cross-section of various implementations of NiFe as a UBM with either Cu or Au or nothing on top of the NiFe layer.

DETAILED DESCRIPTION

To achieve these and other advantages, and in accordance with the purpose of this invention as embodied and broadly described herein, the following detailed embodiments comprise disclosed examples that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention.

The invention comprises a process for manufacturing an electromigration-resistant under-bump metallization (UBM) flip chip structure comprising a Cu layer. This comprises applying to the Cu layer a metallic reaction barrier layer comprising Ni and Fe, where the UBM structure comprises a Sn-rich Pb-free solder bump flip chip structure. Pb-free solders for the purpose of the present invention comprise solders that are substantially free of lead.

In a further embodiment, the present invention comprises both three-layer and four-layer UBM structures to enhance the electromigration performance of Pb-free, Sn-rich solder bumps used in high-end server applications. A typical UBM structure of the invention comprises or consists essentially of 4 layers; 1) adhesion layer, 2) a Cu seed layer for plating, 3) a reaction barrier layer, and 4) a wettable layer for joining to the solder. The adhesion layer comprises or consists essentially of metals selected from the group Cr, TiW, Ti, Ta, V, Nb and their alloys, including combinations thereof. In one embodiment the adhesion layer is form about 200 Å to about 1500 Å thick and in another embodiment the Cu seed layer between said reaction barrier layer and said adhesion layer comprises a layer from about 5000 Å to about 50 um in thickness. In a further embodiment, the Cu seed layer may be applied as a reaction barrier layer and the adhesion layer comprises Cu, and the thickness of the Cu seed layer is from about 0.01 m to about 50 um. In another embodiment, the Cu seed layer is applied as a reaction barrier layer and the adhesion layer comprise Cu to produce a four layer structure, and the four layer structure comprises TiW/Cu/NiFe/Cu.

The reaction barrier layer comprises or consists essentially of metals selected from the group Ni, Fe, Pd, Pt, Co, Cu and their alloys, including combinations thereof. The barrier layer is from about 1 um to about 10 um thick. The wettable layer comprises or consists essentially of metals selected from the group comprising Au, Cu, Pd, Pt, Sn Ag and their alloys, including combinations thereof. A typical reaction barrier layer may comprise Ni—Fe alloy compositions comprising about 50Ni to about 50Fe, about 36Ni to about 64Fe, about 80Ni to about 20Fe, and about 90Ni to about 10Fe and the like. These amounts comprise the wt % of these metals or elements which is the convention used throughout this specification to define these combinations and the other combinations of elements. In another embodiment, the reaction barrier layer may comprise a range of about 5% to about 70% Fe, or about 10% to about 80% Fe with Ni as the balance and alloys thereof. The overall range for the Fe and Ni combinations therefore is from about 5% to about 80% Fe with Ni as the balance and alloys thereof.

Thin films of Ni—Fe alloys can be deposited by the processes of sputtering, electroplating or electroless plating. To facilitate the plating of UBM, a Cu seed layer may be needed between the reaction barrier layer and the adhesion layer to form a four-layer structure, such as TiW/Cu/NiFe/Cu. The barrier layer comprising Ni and Fe is from about 1 um to about 10 um thick.

To enhance the EM performance the thickness of the Cu seed layer can be increased to about 5 um to about to about 50 um. In another embodiment of the invention, the top Cu layer on both the three-layer or four-layer structures may be included or omitted, depending on the manufacturing requirement. In addition, Ni—Fe can be used as a barrier layer with or without a wetting layer on the Cu pillar or thick Cu pedestal structure to further improve EM reliability, wherein the Ni—Fe plated pillar or pedestal is an alternative embodiment on either or both sides of the solder joint, i.e., on either chip or substrate or on both. The substrates comprise art-known materials such as polymeric materials including phenolics, epoxies, and polyimides and equivalents known in the art, or ceramics such as alumina and equivalents known in the art.

Ni—Fe metallurgy can be used as barrier layer on bumps either as a top capping layer or conformably deposited over the exposed surface of pad, pillar or pedestal structures to further improve EM performance and CPI compliance. In an extended application, the NiFe alloying layer can be plated and manufactured by other art-known means on the substrates pad to enhance EM performance. The UBM layer or pad is from about 0.5 um to about 5 um thick, the pedestal is from about 5 um to about 30 um thick, and the pillar is from about 30 um to about 50 um thick. A pre-tin layer or an alloy composed of at least one of Au, Cu, Pd, Ag, In, and Sn, including combinations thereof can be deposited on the NiFe before soldering.

As noted, the invention also comprises three-layer UBM structures for enhanced electromigration resistance of Pb-free, Sn-rich solder bumps used in high-end server applications. The new three-layer UBM structure comprises or consists essentially of 3 layers; 1) adhesion layer, 2) reaction barrier layer, and 3) wettable layer. The adhesion layer comprises or consists essentially of metals selected from Cr, TiW, Ti, Ta and alloys thereof, including mixtures thereof. The reaction barrier layer adhesion layer comprises Cu, and the thickness of the Cu seed layer is from about 0.01 μm to about 50 um. In another embodiment, the Cu seed layer is applied as a reaction barrier layer and the adhesion layer comprise Cu to produce a four layer structure, and the four layer structure comprises TiW/Cu/NiFe/Cu.

The reaction barrier layer comprises or consists essentially of metals selected from the group Ni, Fe, Pd, Pt, Co, Cu and their alloys, including combinations thereof. The barrier layer is from about 1 um to about 10 um thick. The wettable layer comprises or consists essentially of metals selected from the group comprising Au, Cu, Pd, Pt, Sn Ag and their alloys, including combinations thereof. A typical reaction barrier layer may comprise Ni—Fe alloy compositions comprising about 50Ni to about 50Fe, about 36Ni to about 64Fe, about 80Ni to about 20Fe, and about 90Ni to about 10Fe and the like. These amounts comprise the wt % of these metals or elements which is the convention used throughout this specification to define these combinations and the other combinations of elements. In another embodiment, the reaction barrier layer may comprise a range of about 5% to about 70% Fe, or about 10% to about 80% Fe with Ni as the balance and alloys thereof. The overall range for the Fe and Ni combinations therefore is from about 5% to about 80% Fe with Ni as the balance and alloys thereof.

Thin films of Ni—Fe alloys can be deposited by the processes of sputtering electroplating or electroless plating. To facilitate the plating of UBM, a Cu seed layer may be needed between the reaction barrier layer and the adhesion layer to form a four layer structure, such as TiW/Cu/NiFe/Cu. The barrier layer comprising Ni and Fe is from about 1 um to about 10 um thick.

To enhance the EM performance the thickness of the Cu seed layer can be increased to about 5 um to about to about 50 um. In another embodiment of the one embodiment the Ni—Fe or Cu pedestal is from about 5 um to about 30 um thick, and in another embodiment the Ni—Fe or Cu pillar is from about 5 um to about 50 um thick.

In accordance with one embodiment of the present invention, a TiW adhesion layer is sputtered at a thickness of about 500 Å to about 1500 Å or about 1000 Å on a substrate as described herein. The thickness of the adhesion layer can vary widely as long as both good adhesion and good barrier properties are maintained, since the blanket TiW must be etched as the final step in forming the BLM, the film thickness should be minimized consistent with adequate performance. An alternative adhesion layer comprises sputtered Cr at a thickness of about 500 Å to about 1500 Å or about 1000 Å.

Figure 1:
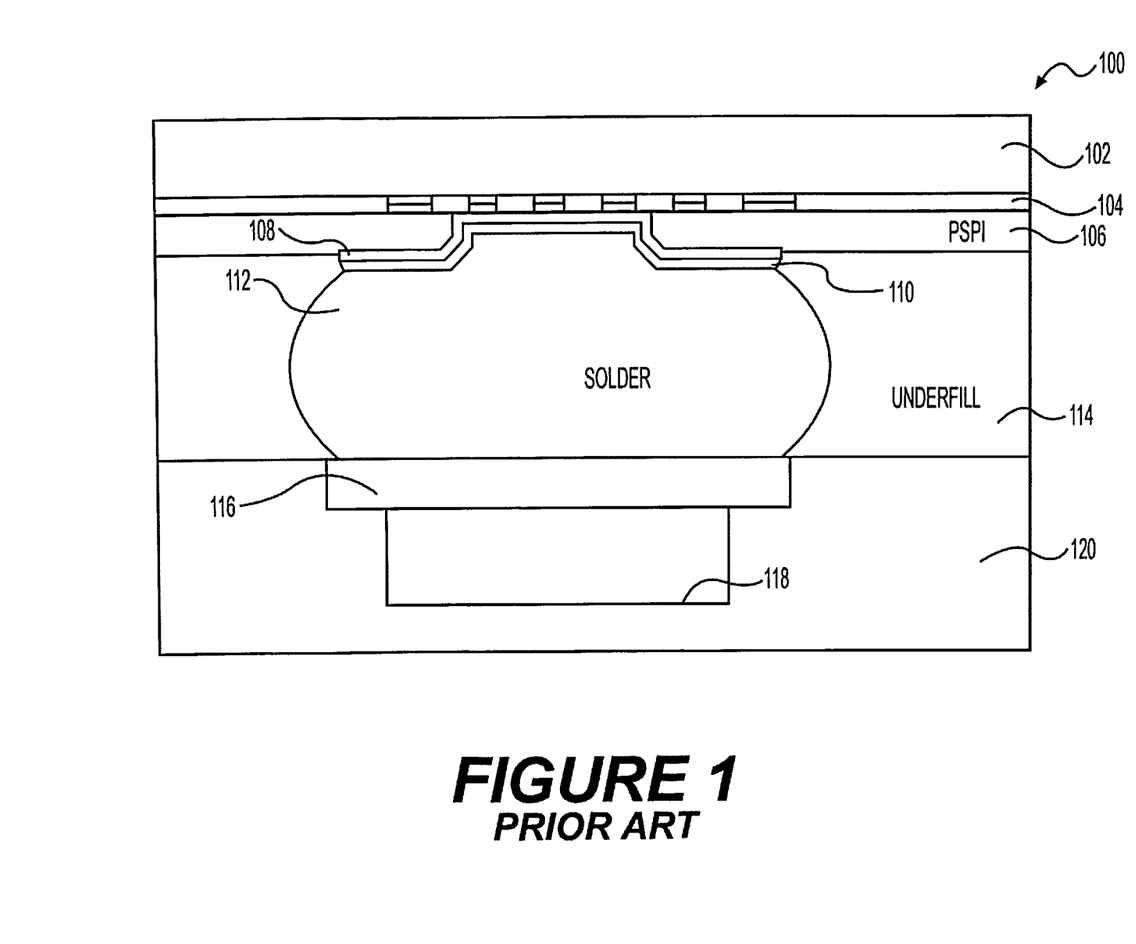
FIG. 1 is a side elevation in cross-section of a prior art UBM structure with a Ni barrier layer.

Referring to the Figures; in FIG. 1, 100 is a prior art semiconductor device including 110, a plated or sputtered Ni UBM, 102 a semiconductor chip with functional circuitry, 104 the last metal layer of the BEOL structure with wiring channels. Element 106 is a photosensitive polyimide that defines vias in the opening of the UBM, 108 is a stack of metal films of adhesion and seed layers for UBM, 112 is a solder, 114 an underfill, 116 Cu wiring on substrate 118, and 120 a substrate which consists of an organic, ceramic, or silicon interposer.

In FIG. 2, 200 is a photomicrograph cross-section image of a prior art solder bump after EM stress in which 210 is a semiconductor chip with functional circuitry, 212 is a void formed in solder after EM testing, 216 is a solder, 218 is an underfill, 219 a metal finish on substrate in this case is Ni(P), and 220 is a substrate. 214 shows a Ni UBM consumed completely after EM testing and illustrate how Ni by itself does not provide a robust EM barrier. The EM test is performed at 150 C with 500 mA current. The electron flow direction is from silicon chip down to the substrate.

Figure 4:
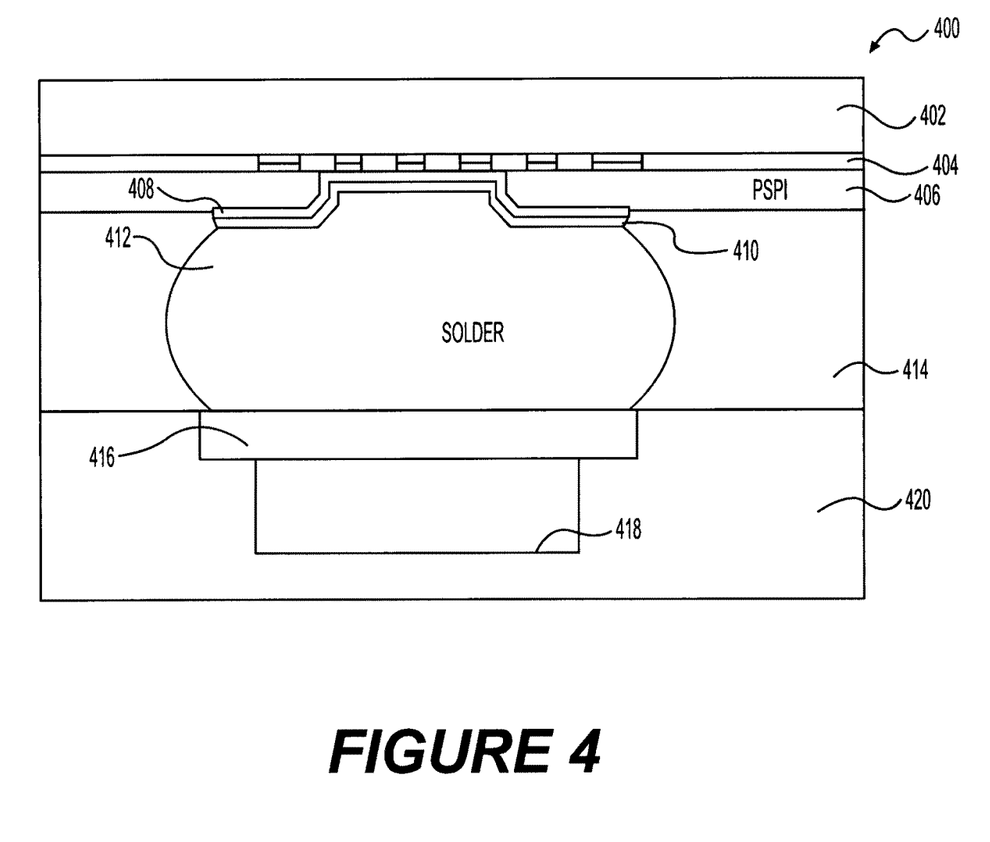
FIG. 4 comprises a side elevation in cross-section of a UBM with a NiFe alloy as a barrier layer.

FIG. 4 comprises a side elevation in cross-section of a UBM with a NiFe alloy as a barrier layer, wherein 400 comprises an illustration of a UBM with NiFe as a barrier layer, further comprising elements 402, a semiconductor chip with functional circuitry, 404 a last metal BEOL structure with wiring channels, 406 a photosensitive polyimide, 408 a stack of metal films of adhesion and seed layer for UBM, 410 a plated or sputtered NiFe UBM, 412 a solder, 414 an underfill, 416 a Cu receiving pad on a substrate, 418 Cu wiring in a substrate, and 420 a substrate which comprises either an organic, ceramic, or silicon interposer.

Figure 5A:
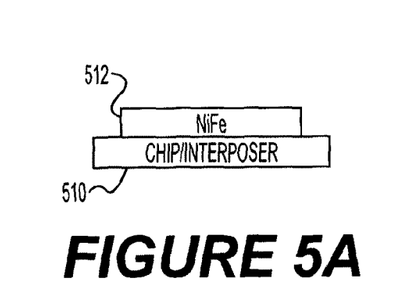
Figure 5B:
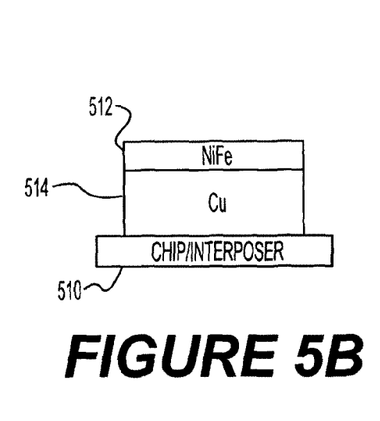
Figure 5C:
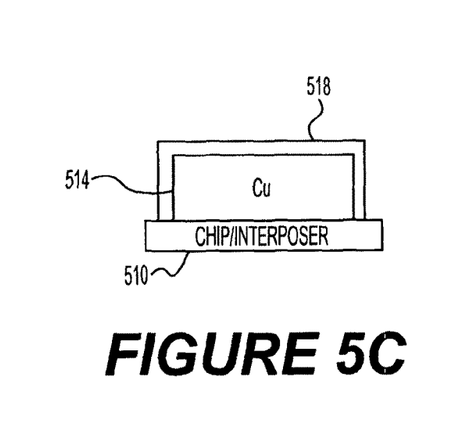
Figure 5D:
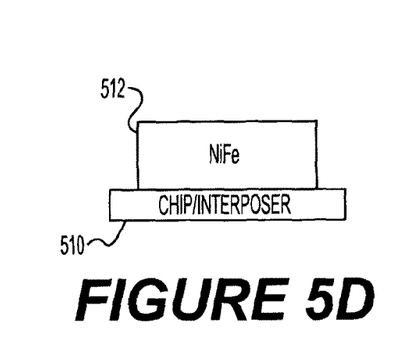
Figure 5E:
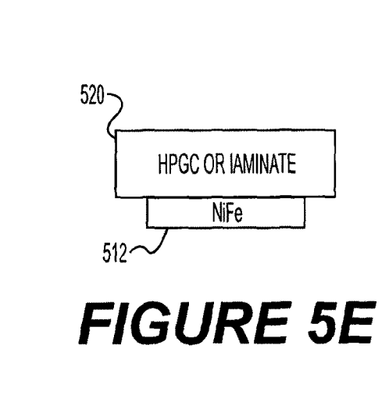
Figure 5F:
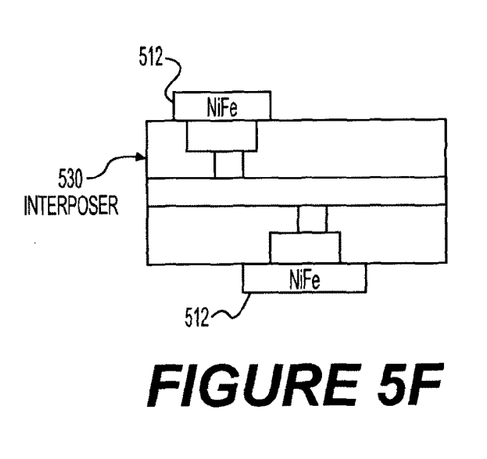

One embodiment as depicted in FIGS. 4 and 5(a) consists of a traditional UBM structure with NiFe barrier layer, TiW/NiFe/Cu. Cu is completely dissolved in solder after reflow and is not depicted in the figure.

FIG. 5 comprises various implementations of NiFe as a UBM comprising 510 a microcircuit chip device or a silicon interposor, 512 a NiFe UBM, either thick (d) or thin (a), stack which comprises an adhesion layer, seed layer for plating (no need for sputter NiFe film), and optional wetting layer, 514 a Cu layer, 518 a NiFe barrier layer surrounding a Cu layer, 520 a ceramic or organic substrate and, 530 an interposer with interconnects on both sides.

FIG. 5, (a) through (f) illustrate various implementations of NiFe as a UBM with either Cu or Au or nothing on top of the NiFe layer. A thin adhesion layer, such as Ti and TiW, is first deposited on the passivation layer and via openings on the chip followed by a thin Cu seed layer deposition. NiFe is subsequently deposited on the sputtered Cu layer. Several structural variations (a) through (e) are described below:

(a) NiFe as thin UBM (about 1 um to about 5 um) on a semiconductor chip or interposor;
(b) NiFe on top of thick Cu UBM (about 1 um to about 50 um) and comprises the embodiment of NiFe which serves as a barrier layer for thick Cu UBM to reduce current crowding and thereby improves EM reliability;
(c) Electroless plated NiFe covers thick Cu UBM (about 5 um to about 50 um) and comprises a variation of the embodiment of FIG. 5(b) wherein electroless plated NiFe covers the exposed surfaces of Cu UBM to prevent undercutting due to Cu/Sn interaction during reflow;
(d) Thick (about 1 um to about 50 um) NiFe UBM and comprises an embodiment that employs thick NiFe UBM;
(e) NiFe as a substrate surface finish, either laminate or HPGC substrates and comprises an embodiment that employs NiFe for organic or ceramic substrate surface finishes.
(f) NiFe as a substrate surface finish for an interposer with interconnects on both sides.

Figure 6:
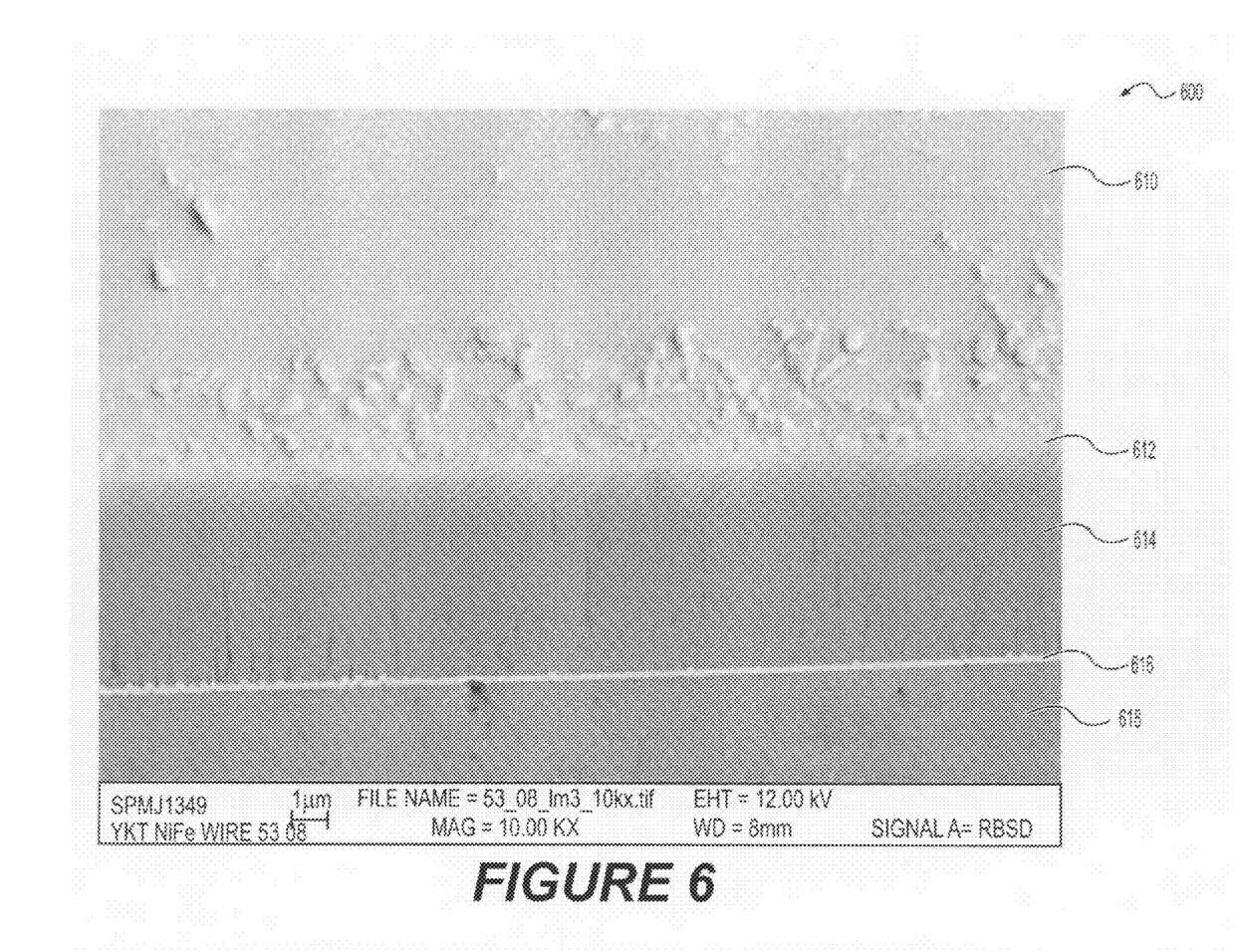
FIG. 6 comprises a photomicrograph of a UBM with a NiFe and SnAg solder interface.

FIG. 6 comprises a photomicrograph 600 of a UBM with a NiFe and SnAg solder, further comprising 610, a SnAg solder, intermetallic layer 612 a NiFe and solder interface with $Fe_2Sn$ intermetallic compound formed after solder reflow, i.e., an interface structure of TiW/NiFe/Cu and Sn1.8Ag solder after reflow, 614 a NiFe UBM layer with sputtered Ni50Fe50 alloy, 616 a TiW adhesion layer, and 618 a silicon substrate. The intermetallic layer 612, an IMC layer, comprises a thin, dense, uniform $Fe_2Sn$ layer formed at the interface, and is stable even after prolonged thermal and electromigration stress, and protects the UBM from EM damage.

Figure 7:
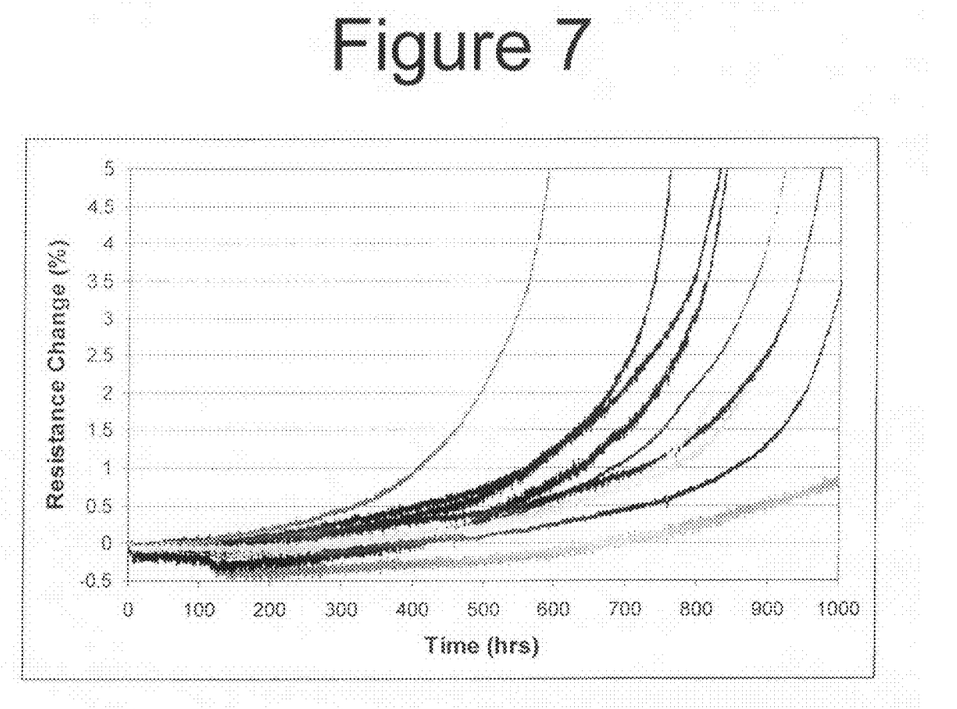
FIG. 7 comprises a plot of percentage of resistance increase ($\Delta R$) "Resistivity Change (%)" of 10 samples with a NiFe/Sn1.8AgSolder/NiFe over time after EM testing where Ni/Fe comprises a barrier layer.

FIG. 7 comprises the plot of resistance change of the NiFe/SnAg solder/NiFe structure. Compared to FIG. 3, the Ni/Solder/Ni case, early EM failures are eliminated, and the EM reliability is improved with NiFe UBM. The NiFe is a sputtered film with composition of Ni50Fe50 and the thickness is about 6 um. A 1500 Å TiW adhesion layer is in between the NiFe film and chip. The solder composition is Sn1.8Ag. The EM testing is conduced at 150° C. and 500 mA.

The sample preparing and testing conditions are identical for all of the ten samples. The only difference between the samples in FIG. 3 and FIG. 7 is the UBM composition, where Ni is the UBM composition in FIG. 3 and NiFe is the UBM composition in FIG. 7.

In other embodiments the NiFe composition comprises about 5% to about 70% Fe with the balance Ni; we can employ an optional wetting or capping layer comprising Au or Cu; and the NiFe thickness can vary from about 0.1 um to about 50 um or from about 1 um to about 10 um.

Without being bound by any theory it would appear that during the application of the layers and/or soldering process the metals in the various layers intermix to form alloys and/or mixtures different than those originally applied to the various surfaces, so the exact composition of the layers after deposition or after formation of the solder joints can vary from the original compositions, i.e., the compositions as they existed prior to their deposition as layers or prior to soldering. Accordingly, we claim the invention as a product or article of manufacture produced by the process of the invention.

Throughout this specification, abstract of the disclosure, and in the drawings, the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" in any claim or as applied to any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, wherein "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including internet sites, as well as issued and pending patents that this written description mentions including the references cited in such scientific journal articles and other articles, including Internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Applicants reserve the right to amend this specification and the drawings filed herein without prejudice or disclaimer and in doing so, they do not disclaim, abandon, or forfeit any invention directly or indirectly represented thereby, and hereby rescind any implied disclaimer that may be inferred from applicants' amendments or cancellation in the course of prosecution of this or any parent, continuation, continuing, continuation in part, divisional, terminally disclaimed, or foreign patent application (related patent application or applications), and specifically preserve all and any inventions embodied not only by the original claims but also the written description, abstract of the disclosure, and drawings of this application and any related patent application or applications, and preserve the right to prosecute claims to these inventions in any related patent application or applications filed prior to or subsequent to the filing of this application.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A process for manufacturing an electromigration-resistant UBM Sn-rich Pb-free solder bump flip chip structure wherein said electromigration-resistant UBM structure consists essentially of a four-layer electromigration-resistant UBM structure or a three-layer electromigration-resistant UBM structure, and wherein said four layer structure consists essentially of, 1) an adhesion layer, 2) a Cu seed layer for plating, 3) a reaction barrier layer, and 4) a wettable layer for joining to said solder, and said three-layer structure is formed by applying to said structure, 1) an adhesion layer, 2) a reaction barrier layer, and 3) a wettable layer for joining to said solder, wherein said 4 layer UBM structure consists essentially of a Cu layer and said reaction barrier layer consists essentially of a Ni—Fe alloy or Cu applied to said Cu layer to eliminate or reduce electromigration.

2. The process of claim 1 wherein said adhesion layer consists essentially of metals selected from Cr, TiW, Ti, Ta, V, Nb and their alloys, and combinations thereof.

3. The process of claim 1 wherein said adhesion layer consists essentially of TiW or Cr.

4. The process of claim 3 wherein said adhesion layer is form about 200 Å to about 1500 Å thick.

5. A process for manufacturing an electromigration-resistant UBM Sn-rich Pb-free solder bump flip chip structure wherein said electromigration-resistant structure consists essentially of a four layer electromigration-resistant UBM structure or a three-layer electromigration-resistant UBM structure, and wherein said four layer structure consists essentially of, 1) an adhesion layer, 2) a Cu seed layer for plating, 3) a reaction barrier layer, and 4) a wettable layer for joining to said solder, and said three-layer structure is formed by applying to said structure, 1) an adhesion layer, 2) a reaction barrier layer, and 3) a wettable layer for joining to said solder, wherein said UBM 4 layer structure consists essentially of a Cu layer and said reaction barrier layer essentially of a Ni—Fe alloy or Cu applied to said Cu layer to eliminate or reduce electromigration, wherein said reaction barrier layer is selected from xNi-yFe, Pt, Cr or Co, and their alloys, and combinations thereof.

6. The process of claim 5 wherein said reaction barrier layer consists essentially of thin films of Ni—Fe deposited by the processes consisting essentially of sputtering, electroplating or electroless plating.

7. The process of claim 5 wherein said reaction barrier layer consists essentially of films of Ni—Fe ranging in thickness of from about 1 um to about 50 um.

8. A product made by the process of claim 1.

9. The process of claim 1 further consisting essentially of a reflow of said Sn-rich Pb-free solder bump to dissolve said Cu layer in said solder bump where said Cu layer abuts said solder bump.

10. A process for manufacturing an electromigration-resistant UBM Sn-rich Pb-free solder bump flip chip structure wherein said electromigration-resistant structure consists essentially of a four layer electromigration-resistant UBM structure or a three-layer electromigration-resistant UBM structure, and wherein said four layer structure consists essentially of, 1) an adhesion layer, 2) a Cu seed layer for plating, 3) a reaction barrier layer, and 4) a wettable layer for joining to said solder, and said three-layer structure is formed by applying to said structure, 1) an adhesion layer, 2) a reaction barrier layer, and 3) a wettable layer for joining to said solder, wherein said UBM 4 layer structure consists essentially of a Cu layer and said reaction barrier layer essentially of a Ni—Fe alloy or Cu applied to said Cu layer to eliminate or reduce electromigration, wherein said reaction barrier layer is selected from xNi-yFe, CrCu, or NiCu.

11. A product made by the process of claim 10.

12. The process of claim 1 wherein said reaction barrier layer consists essentially of about 5% to about 80% Fe with Ni as the balance and consists essentially of alloys thereof and mixtures thereof.

13. The process of claim 12 wherein said UBM structure consists essentially of a substrate and a circuit board and incorporates a Cu pad, Cu pedestal, or Cu pillar structure between said substrate and said circuit board.

14. The process of claim 13 wherein said Ni—Fe alloy is positioned as a barrier layer with or without said wetting layer on said Cu pad, Cu pillar, or Cu pedestal structure to further improve EM performance and CPI compliance.

15. The process of claim 12 wherein said UBM structure consists essentially of a chip and a substrate and incorporates a pad, pedestal, or pillar structure between said substrate and said chip consisting essentially of said UBM structure and said Ni—Fe alloy is operatively associated with said pad, said pillar, or said pedestal.

16. The process of claim 12 wherein said Ni—Fe alloy operatively associated with said pad, said pillar, or said pedestal is deposited on either said chip, or said substrate, or both.

17. The process of claim 15 wherein said Ni—Fe alloy is applied as a barrier layer on said solder bumps either as a top capping layer or conformably deposited over the exposed surface of said pad, said pillar or said pedestal structure to further improve EM performance and CPI compliance.

18. The process of claim 12 wherein said wettable layer consisting essentially of at least one of Au, Cu, Pd, Pt, Ag, In and Sn and alloys thereof or combinations thereof is deposited on said Ni—Fe alloy prior to soldering said structure.

19. The process of claim 12 consisting essentially of depositing said wettable layer of at least one of Au, Cu, Pd, Pt , Ag, In and Sn, and their alloys and combinations thereof on said Ni—Fe alloy and subsequently soldering said structure.

20. The process of claim 1 wherein said reaction barrier layer consists essentially of Ni—Fe compositions consisting essentially of about 50 Ni to about 50 Fe, about 36 Ni to about 64 Fe, about 80 Ni to about 20 Fe, and about 90 Ni to about 10 Fe.

21. The process of claim 1 wherein said wettable layer consists essentially of metals selected from Au, Cu, Pd, Pt, Sn, In, and Ag, and their alloys, and combinations thereof.

22. The process of claim 1 wherein said Cu seed layer is applied as a reaction barrier layer and said adhesion layer consists essentially of Cu.

23. The process of claim 22 wherein said adhesion layer comprises consists essentially of Cu, and the thickness of said Cu seed layer is from about 0.01 um to about 50 um.

24. The process of claim 22 wherein said Cu seed layer is applied to said NiFe alloy as a reaction barrier layer and said adhesion layer comprise Cu to produce a four layer structure, and said four layer structure consists essentially of TiW/Cu/NiFe/Cu.

25. The process of claim 1 wherein said four layer structure consists essentially of TiW/Cu/NiFe/Cu.

26. The process of claim 1 wherein said Cu seed layer between said reaction barrier layer and said adhesion layer comprises consists essentially of a layer from about 0.01 um to about 50 um in thickness.

27. The process of claim 1 wherein a top Cu wetting layer on both the three- or four-layer structures may be included or omitted.

28. The process of claim 1 wherein said UBM structure incorporates a pad, pedestal, or pillar structure between a substrate and a circuit board consisting essentially of said UBM structure.

29. The process of claim 1 wherein said UBM structure comprise a substrate and a circuit board and incorporates a Cu pad, Cu pedestal, or Cu pillar structure between said substrate and said circuit board.

30. A product made by the process of claim 5.

31. The process of claim 1 further consisting essentially of a reflow of said Sn-rich Pb-free solder bump to dissolve said Cu layer in said solder bump where said Cu layer abuts said solder bump.

* * * * *